United States Patent [19]

Corridori

[11] Patent Number: 4,854,882
[45] Date of Patent: Aug. 8, 1989

[54] FLOATABLE SURFACE MOUNT TERMINAL

[75] Inventor: Anthony J. Corridori, Worcester, Mass.

[73] Assignee: Augat Inc., Attleboro, Mass.

[21] Appl. No.: 283,187

[22] Filed: Dec. 12, 1988

[51] Int. Cl.[4] .............................................. H01R 9/09
[52] U.S. Cl. ...................................... 439/83; 439/246; 439/248; 439/78; 439/876
[58] Field of Search ................ 439/70, 78, 79, 81–83, 439/246–248, 252, 603, 744–747, 876, 884, 888

[56] References Cited

U.S. PATENT DOCUMENTS

| 4,053,199 | 10/1977 | Hollyday et al. | 439/83 |
| 4,220,383 | 9/1980 | Scheingold et al. | 339/17 CF |
| 4,236,776 | 12/1980 | Wellington | 439/83 |
| 4,358,172 | 9/1982 | Narozny | 339/17 F |
| 4,359,258 | 9/1982 | Palecek et al. | 339/176 MP |
| 4,377,321 | 3/1983 | Weisenburger | 339/220 R |
| 4,421,368 | 12/1983 | Saban | 439/83 |
| 4,421,374 | 12/1983 | Montilla, Jr. et al. | 339/97 P |
| 4,466,684 | 8/1984 | Grant et al. | 339/176 M |
| 4,526,429 | 7/1985 | Kirkman | 439/82 |
| 4,678,250 | 7/1987 | Romine et al. | 439/876 |
| 4,693,528 | 9/1987 | Asick et al. | 439/83 |
| 4,701,004 | 10/1987 | Yohn | 439/871 |
| 4,753,602 | 6/1988 | Peyrat et al. | 439/246 |

Primary Examiner—P. Austin Bradley
Attorney, Agent, or Firm—Weingarten, Schurgin, Gagnebin & Hayes

[57] ABSTRACT

A surface mountable electronic component socket for mounting on the surface of a printed circuit board includes a socket made of insulative material and a plurality of surface mountable terminals which are disposed within the socket body. Each terminal includes a lead portion for surface mounting on an associated contact area of a circuit board, and a hollow body section adapted to receive the lead of an integrated circuit or other electronic component. Each terminal is axially movable of floatable within its respective opening in the socket. This axial movement of the terminals accommodates misalignment which may occur between the surface mounted leads and the printed circuit board thereby providing reliable engagement of the socket with the circuit board.

8 Claims, 1 Drawing Sheet

FLOATABLE SURFACE MOUNT TERMINAL

FIELD OF THE INVENTION

This invention relates to electronic component sockets and, more particularly, to terminals for surface mounting on a printed circuit board.

BACKGROUND OF THE INVENTION

Electronic component sockets in which electronic components are retained by component leads which are inserted into socket terminals wherein said terminals are disposed within the socket body are well known for use with printed circuit boards. The component socket typically has a plurality of terminals fixed in a predetermined configuration within the socket body, each terminal having a downwardly extending lead portion for insertion into a plated opening in the printed circuit board on which the socket is mounted. Most commonly, the terminal configuration of the socket is of a standard pattern to match the lead pattern of cooperative components which are mated with the socket, such as a dual in-line package having parallel rows of equispaced leads. The leads of the component socket generally extend through the plated openings of a circuit board where the leads are soldered to the circuit board to make their respective electrical connections. In such a configuration, any tilt of the socket in relation to the board or any other non-planarity of the mounting surface does not usually affect the mounting of the socket or the integrity of the electrical connections between the leads and the circuit board.

It has become increasingly common to employ surface mount component sockets having lead portions which are butted against contact areas on a circuit board rather than leads which extend through plated holes in a circuit board. As a result of having surface mount component sockets, the planarity of the circuit board mounting surface in relation to the surface mount leads of a component socket becomes more critical: a non-planar mounting surface, or a surface tilted or vibrated with respect to the plane of the mounting ends of the surface mount terminal leads, can result in particular leads having poor contact with circuit board contact areas, or having no electrical contact at all. It is, therefore, important that a surface mountable socket have surface mount leads which can form a reliable contact with a circuit board despite the presence of misalignments or vibration between the board surface and the component.

SUMMARY OF THE INVENTION

In accordance with the present invention, a surface mountable electronic component socket is provided for mounting on the surface of a printed circuit board in a reliable manner and wherein the surface mounted leads of the socket provide reliable contact with the contact areas of the circuit board despite the presence of misalignment or vibration between the mounting surface of the board and the component socket. The component socket comprises a housing of insulative material having a plurality of terminals carried by the socket housing, each of the terminals being axially moveable or floating within respective openings of the housing. Each of the terminals include a lead portion for surface mounting on an associated contact area of the circuit board, and a body section adapted to receive the lead of an integrated circuit or other electronic component. The axial movement of the terminals in the socket housing accommodates misalignment or non-planarity which may occur between the surface mounted leads of the socket and the printed circuit board mounting surface thereby providing reliable engagement of the socket leads with the circuit board.

DESCRIPTION OF THE DRAWINGS

The invention will be more fully understood from the following detailed description taken in conjunction with the accompanying drawings in which.

DETAILED DESCRIPTION OF THE INVENTION

Figure 1:
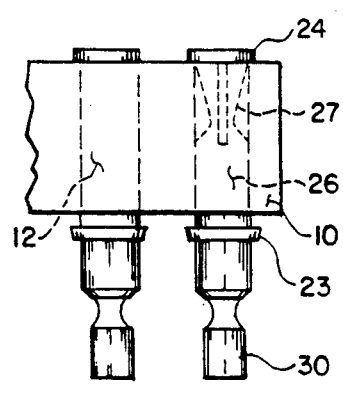
FIG. 1 is a side view of a socket with floatable terminal leads in accordance with the present invention.
Figure 2:
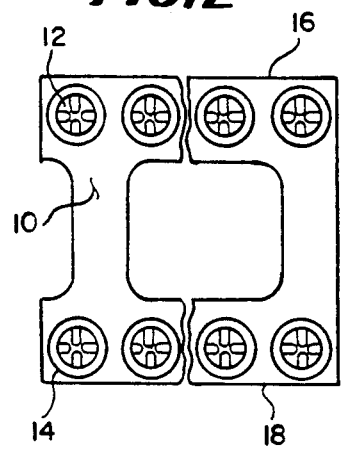
FIG. 2 is a top view of the embodiment of FIG. 1.
Figure 3:
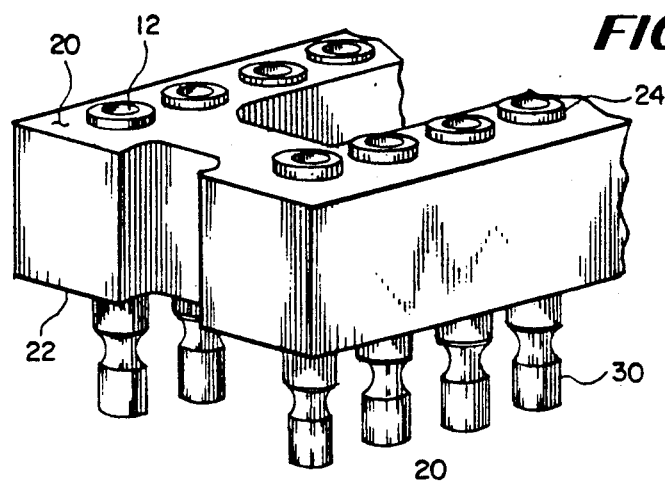
FIG. 3 is a top perspective view of the embodiment of FIG. 1.
Figure 5:
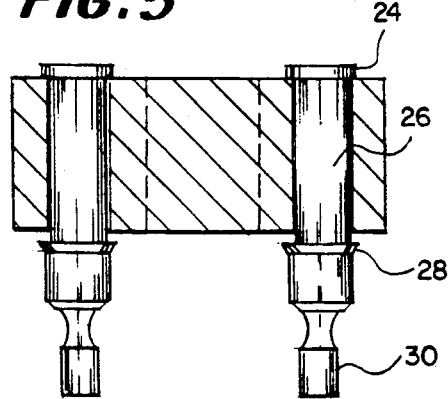
FIG. 5 is a cutaway view of the embodiment of FIG. 1.

An electronic surface mount component socket and electronic terminals in accordance with the present invention are shown in FIGS. 1-5. FIG. 1 depicts a socket body 10 of insulative material with a plurality of floatable terminals 12 disposed therein. The body 10 is comprised of a plurality of through holes 14 to receive respective terminals 12. The body 10 is further defined by opposing external side walls 16 and 18, as well as opposing top and bottom faces 20 and 22 wherein through holes 14 typically extend along the length of the opposing side walls 16 and 18 and through the socket body 10 extending from the top face 20 to the bottom face 22.

Each terminal 12 comprises a head portion 24, a hollow body section 26, a retaining means 28, and a contact lead 30. The terminal 12 is inserted into the socket 10 by pressing the lead 30 into a through hole 14 such that the retaining means 28 passes through the bottom face 22 of the socket 10 and the head portion 24 of the terminal 12 comes to rest against the top face 20 of the socket 10. This insertion process leaves the retention means 28 exposed beyond the bottom face 22 of the socket 10 and the hollow body section 26 of the terminal 12 lodged within the socket 10. The hollow body section 26 is slightly smaller in size than the through hole 14 such that when the terminal 12 is placed within a through hole 14 it is snug but not gripped by the walls of the through hole 14 and the terminal 12 can axially traverse the distance limited by the bottom of the head portion 24 and the top of the retention means 28. As a result, a terminal 12 is disposed within socket 10 such that the terminal 12 can be affixed to an electronic circuit board by surface mounting the end at lead 30 to a contact area of a circuit board, and an electronic component lead can be inserted through the head portion 24 into the hollow body section 26 in which a multi-finger contact 27 is disposed for engagement with the respective component lead inserted therein.

The present invention allows a fixed contact to be maintained between the terminal 12 and an electronic circuit board while the terminal is permitted to move or float within the socket body 10. Such movement is desirable when an outside force is exerted upon a circuit board, for example vibrations or flexing of the board or when misalignment occurs between the socket and the circuit board. The socket of the present invention, with terminals that float within the socket, becomes more desirable as the number of terminals 12 increases, since an increase in the number of terminals causes an increase in length of the socket which creates a higher degree of susceptibility to misalignment or to external forces. Thus, the present invention maintains coplanarity of the circuit board with respect to the plane created by the lead portion of the terminals.

Figure 4:
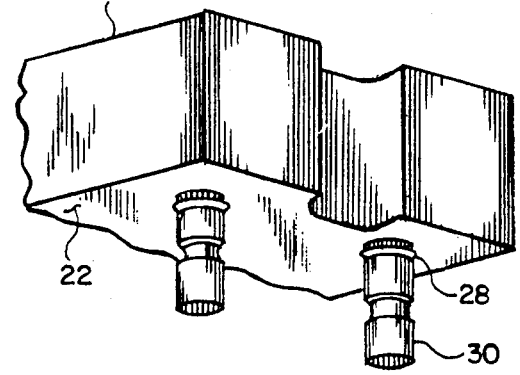
FIG. 4 is bottom perspective view of the embodiment of FIG. 1.

FIG. 4 shows a bottom perspective of a socket 10 where a terminal 12 is inserted into a through hole 14 on the top face 20 of the socket 10 and extends beyond the bottom face 22 of the socket 10. The head portion 24 and the retention means 28 define the extent to which the terminal 12 can move axially within the socket 10. The retention means 28 extends beyond the bottom face 22 of the socket 10 when the head portion 24 is seated on the top face 20 of the socket 10. Thus, the terminal 12 of the present invention has a body section 26 with a length which is greater than the thickness of the socket body 10 as demarcated by the bottom of the head Portion 24 and the top of the retention means 28. This length can be varied according to the specifications of the thickness of the socket 10 or the expected external environmental factors in which the socket is to be deployed.

The retention means 28 is rigid, having a conical shape such that the outside wall of the retention means 28 tapers toward the lead portion 30 of the terminal 12, and the upper edge of the retention means 28 forms a lip extending perpendicular to the body section of the terminal 12. This shape allows the terminal 12 to pass through a through hole 14 as it is inserted into a somewhat resilient socket while also creating a self-retaining lip preventing the terminal 12 from passing in an opposite direction through a through hole 14 in order to maintain the terminal within the socket 10.

The electronic component socket of the present invention permits the surface mounting of electronic components on a rigid or flexible circuit board wherein engagement with the circuit board is maintained despite the existence of vibration and/or board flexing as well as other vertical variances produced by thermal expansion or uneven coats of solder paste. The disclosed invention is not to be limited by what has been particularly shown and described except as indicated by the present claims.

What is claimed is:

1. A surface mount socket for removably retaining an electronic component having a plurality of leads, the socket comprising:
   a housing of insulative material having a plurality of through holes, each having a diameter sized to receive and retain a respective terminal; and
   a plurality of terminals each retained in a respective through hole of the housing, each of the terminals including:
   a body section having a head portion on one end and a lead portion on the opposite end;
   the body section having an outside diameter slightly smaller than the diameter of the through hole of the housing and an axial length greater than the length of the through hole to permit axial movement of the terminal in the through hole;
   the head portion having a diameter larger than the diameter of the through hole; and
   the head portion having a diameter larger than the diameter of the through hole; and
   at the juncture between the body section and the lead portion and having a diameter greater than the diameter of the through hole.

2. The surface mount socket of claim 1 wherein:
   each of said plurality of terminals is retained in said housing by said head portion and said retaining means such that each terminal is axially movable over a length defined by a space separating the head portion and the retaining means;
   the body section and head portion include a cavity for receipt of a lead of an electronic component mounted on the socket; and
   the lead portion includes an outer end surface, mountable on a contact area of a printed circuit board.

3. A terminal for removably retaining an electronic component lead and for mounting within a through hole in a socket wherein said terminal comprises:
   a body section having a head portion on one end and a lead portion on the opposite end;
   the body section having an outside diameter slightly smaller than the diameter of the through hole of the socket and an axial length greater than the length of the through hole to permit axial movement of the terminal in the through hole;
   the head portion having a diameter larger than the diameter of the through hole into which the terminal is to be mounted; and
   retaining means integral with the terminal and disposed at the juncture between the body section and the lead portion and having a diameter greater than the diameter of the through hole into which the terminal is to be mounted.

4. The terminal of claim 3, wherein the retaining means includes a tapered ring having its greater diameter confronting a through hole of a socket in which the terminal is mounted.

5. The terminal of claim 4, wherein the lead portion of the body section includes a contact for surface mounting to a contact area of a circuit board.

6. The terminal of claim 3 wherein:
   the terminal is retained in the socket by the head portion and the retaining means and is axially movable over a length defined by a space separating the head portion and the retaining means;
   the body section and the head portion having an internal cavity for receipt of a lead of an electronic component mounted on the socket; and
   the lead portion having an outer end surface, mountable on a contact area of a printed circuit board.

7. The terminal of claim 6, wherein said retaining means comprises a top edge and an outer wall wherein:
   the top edge extends perpendicular to the outside diameter of the body section; and
   the outer wall tapers from said top edge to the lead portion.

8. The terminal of claim 4, wherein the internal cavity of the body section includes means for engaging a lead of an electronic component.

* * * * *

UNITED STATES PATENT AND TRADEMARK OFFICE
CERTIFICATE OF CORRECTION

PATENT NO. : 4,854,882

DATED : August 8, 1989

INVENTOR(S) : Anthony J. Corridori

It is certified that error appears in the above-identified patent and that said Letters Patent is hereby corrected as shown below:

On the title page:

In the Abstract, line 10, "of" should read --or--.

In Column 3, line 22-23, "Por-tion 24" should read --portion 24--.

In Column 4, line 7, before "at the" please insert --retaining means integral with the terminal and disposed--.

Signed and Sealed this

Fifth Day of May, 1992

*Attest:*

DOUGLAS B. COMER

*Attesting Officer*     *Acting Commissioner of Patents and Trademarks*